United States Patent [19]
Cox

[11] Patent Number: 4,654,603
[45] Date of Patent: Mar. 31, 1987

[54] LOW INPUT-CAPACITANCE AMPLIFIER FOR DRIVING GUARD SHIELD CONDUCTORS

[76] Inventor: Harold A. Cox, Hwy. 49 North, Rte. 7, Box 307, Hattiesburg, Miss. 39401

[21] Appl. No.: 814,005

[22] Filed: Dec. 19, 1985

Related U.S. Application Data

[63] Continuation of Ser. No. 568,666, Jan. 6, 1984, abandoned.

[51] Int. Cl.$^4$ .............................................. H03F 1/14
[52] U.S. Cl. .................................. 330/292; 330/286; 330/297
[58] Field of Search ........................ 330/68, 70, 71, 76, 330/78, 156, 292, 297, 2, 286; 307/308; 328/5

[56] References Cited

U.S. PATENT DOCUMENTS 2,489,272 11/1949 Daniels ................................. 330/68
2,623,996 12/1952 Gray .................................. 330/68 X
2,795,654 6/1957 MacDonald .......................... 330/70
3,253,225 5/1966 Dalton et al. ....................... 330/70 X
3,995,175 11/1976 Hoyt et al. ...................... 330/292 X
4,471,319 9/1984 Metz ............................... 330/292 X

OTHER PUBLICATIONS

1984 D.A.T.A. Book, vol. 29, Book 2, Mar. 1984, pp. 24, 145.
Krakauer, "Electrometer Triode Follower", The Review of Scientific Instruments, vol. 24, No. 7, Jul. 1953, pp. 496–500.
Thomas, "Microelectrode Amplifier with Improved Method of Input-Capacitance Neutralization", Medical and Biological Engineering & Computing, vol. 15, No. 4, Jul. 1977, pp. 450–454.
Thomas, "Input Capacitance Feedback Improves Neutralization", Electronics, Jan. 20, 1977, pp. 112, 113.

Primary Examiner—James B. Mullins
Attorney, Agent, or Firm—Hubbard, Thurman, Turner & Tucker

[57] ABSTRACT

A low input-capacitance amplifier is disclosed for utilization in driving a guard shield of a high impedance signal. The high impedance signal is applied to a central conductor and to the input of a first unity gain amplifier. The output of that unity gain amplifier is applied to a second unity gain amplifier which is utilized to provide the guard signal to the shield conductor and also to provide electrical power to the first unity gain amplifier. A preferred embodiment of the present invention is utilized in conjunction with a highly sensitive capacitance proximity sensor which has a sense electrode remotely located from the associated electronic circuitry. By utilizing the output of the second unity gain amplifier as the power source for the first amplifier the input, the output and all electrical power receiving nodes are maintained at substantially identical electrical potentials thereby nullifying the loading effect of any parasitic capacitances at the input of the first amplifier circuitry.

15 Claims, 1 Drawing Figure

U.S. Patent   Mar. 31, 1987   4,654,603
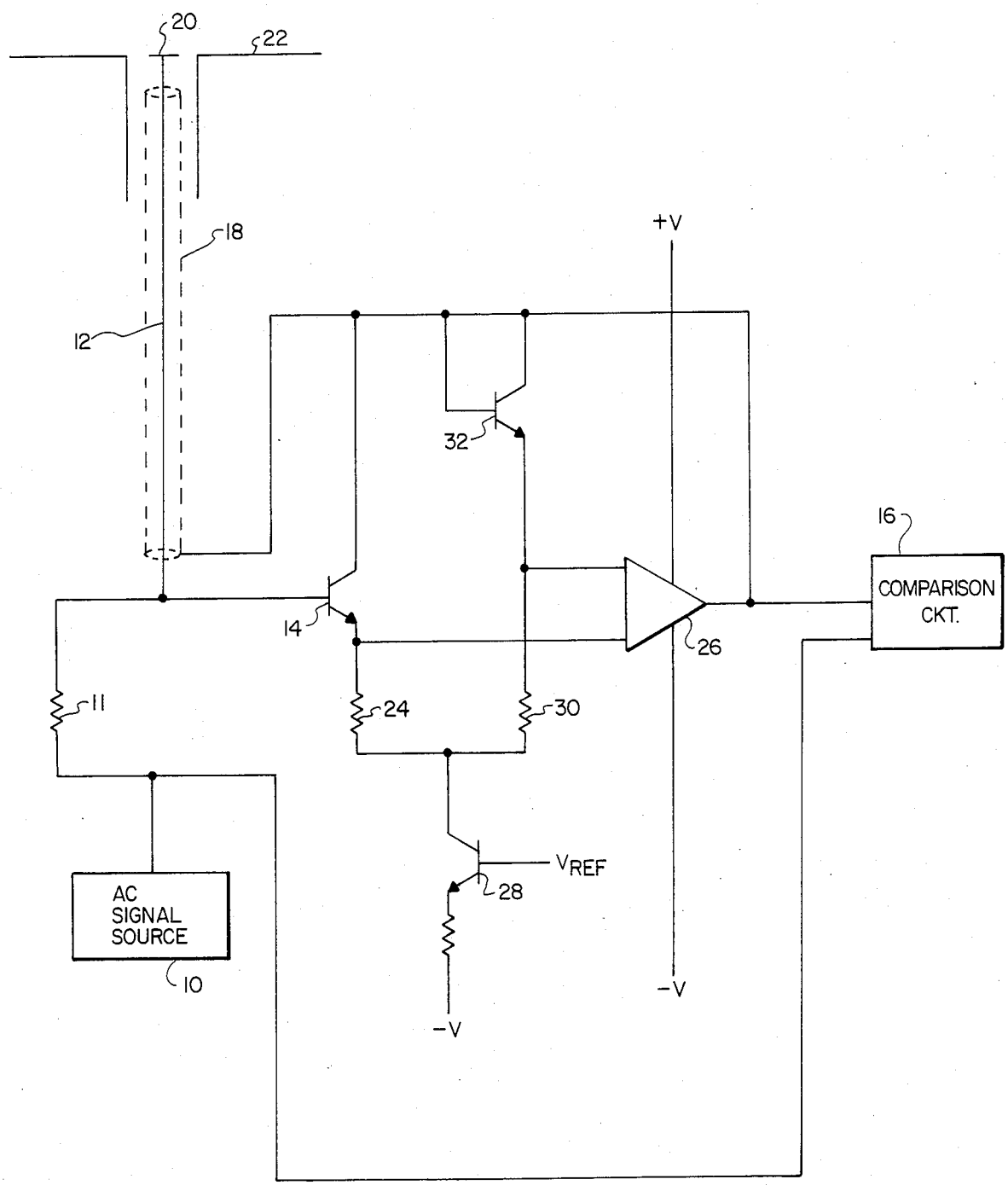

4,654,603

LOW INPUT-CAPACITANCE AMPLIFIER FOR DRIVING GUARD SHIELD CONDUCTORS

This is a continuation of application Ser. No. 568,666, filed Jan. 6, 1984, and now abandoned.

BACKGROUND OF THE INVENTION

This invention relates in general to amplifiers and more particularly to amplifier circuits having means for minimizing the input-capacitance thereof. Still more particularly, this invention relates to amplifier circuitry useful in driving the guard shield of a highly sensitive proximity sensor which operates by detection of varying capacitance at a remotely disposed sense electrode.

Proximity sensors are well known in the prior art. Such systems often operate by utilizing magnetic or optical detectors which generate a signal in response to the presence or absence of a object. More recently, capacitive proximity sensors have been utilized which use a high impedance AC signal to detect variations in the capacitive loading of the AC signal due to the presence of an object. However, these capacitive proximity sensors suffer from a severe shortcoming in that small variations in parasitic capacitance in the associated electronic circuitry may cause faulty indications. Typically, these systems are sensitive to capacitive variations at the sense electrode on the order of 0.005 picoFarads. Thus, those skilled in the art will appreciate that parasitic capacitance can generate a major problem when present in the associated circuitry utilized with a proximity sensor of this type.

A second shortcoming of these capacitive proximity sensors is also related to the highly susceptible nature of the high impedance AC signal utilized. It is often necessary to dispose the electronic circuitry associated with these sensors at some distance from the sense electrode itself due to an adverse or hostile environment in which an object must be sensed. Examples of this situation include the various hostile environments to which a semiconductor wafer must be exposed during fabrication. The necessity of utilizing remote sense electrodes generates a second problem with the stray capacitance found in most electrical transmission lines. The approach typically utilized in the prior art to solve this problem is to drive an outer conductor or "guard shield" with an buffered version of the signal being guarded. This maintains both the inner conductor and the guard shield at identical electrical potentials and minimizes the capacitance in the transmission line. However, the necessity of amplification introduces additional electronic circuitry which necessarily includes additional parasitic capacitance.

One approach utilized in the prior art to offset the effect of parasitic capacitance is to capacitively inject current onto the signal node being guarded equal and opposite to that being lost to parasitic capacitance. One major disadvantage to this approach is the difficulty in making such neutralization independent of temperature. Parasitic capacitances in semiconductor devices are highly subject to temperature variation and may fluctuate greatly in response to these temperature variations. Thus, it is very difficult to choose a particular level of compensation for parasitic capacitance which will be effective throughout a large temperature range.

SUMMARY OF THE INVENTION

It is therefore one object of the present invention to provide an improved low input-capacitance amplifier.

It is another object of the present invention to provide an improved low input-capacitance amplifier which is highly temperature stable.

It is yet another object of the present invention to provide an improved temperature stable low input-capacitance amplifier which can be utilized to drive the guard shield of a high impedance AC signal.

It is another object of the invention to provide an improved method of guarding high impedance AC signals on a shielded electrical conductor.

It is yet another object of the present invention to provide an improved capacitive proximity sensor circuit for utilization with systems having a sense electrode remotely located from the associated electronic circuitry.

The foregoing objects are achieved as is now described. A low input-capacitance amplifier is provided for utilization in driving a guard shield of a high impedence AC signal. The high impedance AC signal is applied to a central conductor and to the input of a first unity gain amplifier. The output of that unity gain amplifier is applied to a second unity gain amplifier which is utilized to provide the guard signal to the shield conductor and also to provide electrical power to the first unity gain amplifier. A preferred embodiment of the present invention is utilized in conjunction with a highly sensitive capacitance proximity sensor which has a sense electrode remotely located from the associated electronic circuitry. By utilizing the output of the second unity gain amplifier as the power source for the first amplifier the input, the output and all electrical power receiving nodes are maintained at substantially identical AC electrical potentials thereby nullifying the loading effect of any parasitic capacitances at the input of the first amplifier circuitry.

BRIEF DESCRIPTION OF THE DRAWING

The novel features believed characteristic of the invention are set forth in the appended claims. The invention itself; however, as well as a preferred mode of use, further objects and advantages thereof, will best be understood by reference to the following detailed description of an illustrative embodiment when read in conjunction with the accompanying figure, wherein:

The lone FIGURE depicts a schematic diagram of a remote proximity sensor system utilizing the low input-capacitance amplifier of the present invention.

DETAILED DESCRIPTION OF THE INVENTION

With reference now to the FIGURE, there is depicted a schematic representation of a remote capacitive proximity sensor which utilizes the low input-capacitance amplifier of the present invention. As can be seen, AC signal source 10 is utilized to provide an AC signal which is coupled to one input of phase and magnitude comparison circuit 16 and through high impedance resistor 11 to inner conductor 12 and to the base of transistor 14. Of course, those skilled in the art will appreciate that the depicted circuit is somewhat simplified in nature and that various filters, level adjusting circuits and other circuit elements will normally be interposed between AC signal source 10 and phase and magnitude comparison circuit 16.

As is illustrated, inner conductor 12 is shielded by an outer coaxial conductor 18 and is coupled at a second end thereof to a remote sense electrode 20 which is disposed within a sensor assembly 22. Again, those skilled in the art will appreciate that sensor assembly 22 will typically be built into a machine and that multiple sense electrodes may be utilized with a single material handling machine.

In order to provide a low impedance guard signal to shield the high impedance AC signal on inner conductor 12, the high impedance AC signal is coupled to the base of transistor 14. As can be seen, transistor 14 is coupled in an emitter follower configuration and will thus function as a unity gain amplifier. The emitter bias current of transistor 14 is determined by a constant current regulator which is provided by transistor 28, which has a reference voltage applied to the base thereof. The output of the unity gain amplifier is taken at the emitter of transistor 14 and is applied to the noninverting input of amplifier 26, a standard operational amplifier which is also configured for unity gain. The output of operational amplifier 26 is then coupled back to coaxial conductor 18 and to the collector of transistor 14. Thus, it should be obvious to those skilled in the electronics art that while the collector, emitter and base of transistor 14 are all held at the same AC potential, the input-capacitance of the amplifier thus formed will be virtually eliminated.

In addition to providing the guard signal and the electrical power source for transistor 14, the output of operational amplifier 26 is also coupled to phase and magnitude comparison circuit 16 which is utilized to detect those changes in phase and magnitude of the AC signal which will occur in response to the presence of an object at or near sense electrode 20.

In the manner depicted herein, the capacitance sensitive signal which is applied to the base of transistor 14 is not degraded by the parasitic capacitance of the transistor amplifier circuit because each of the transistor's terminals are experiencing an identical AC signal. The emitter-to-base capacitance, $C_{eb}$, does not load the sensitive signal because of the nature of an emitter follower, in that the emitter voltage closely tracks the base voltage with only a DC offset. Likewise, the collector-to-base capacitance $C_{cb}$ is minimized because the collector is driven by the output of operational amplifier 26 and experiences the same AC voltage as the emitter and base.

As can be seen, in the FIGURE, transistor 32 is coupled in diode configuration between the output of operational amplifier 26 and the inverting input terminal thereof. Transistor 32 is chosen to have matched characteristics with transistor 14 and is coupled in a diode configuration having its collector and base both tied to the output of operational amplifier 26. The emitter bias current of transistor 32 is also determined by the constant current source formed by transistor 28. Resistor 24 and 30 are chosen to be equal in resistance so that an identical amount of current flows through transistors 32 and 14, thus ensuring an equal voltage drop across these transistors. Because of the presence of transistor 32 coupled in this manner, the collector of transistor 14 is offset in DC voltage from the voltage at the emitter. This offset will be equal to one diode drop. In this manner, with the collector of transistor 14 one diode drop higher than its emitter, transistor 14 will operate in its active region. And, since the base of transistor 14 is forward biased and one diode drop higher in voltage than the emitter, the base and collector of transistor 14, i.e. the input and output of the entire circuit, are at very nearly the same DC voltage. Of course, those ordinarily skilled in the art will appreciate that the DC offset function performed by transistor 32 may also be performed by utilizing a diode or other DC level shifting device.

Although the invention has been described with reference to a specific embodiment, this description is not meant to be construed in a limiting sense. Various modifications of the disclosed embodiment as well as alternative embodiments of the invention will become apparent to persons skilled in the art upon reference to the description of the invention. It is therefore contemplated that the appended claims will cover any such modifications or embodiments that fall within the true scope of the invention.

What is claimed is:

1. A highly sensitive capacitance proximity sensor having a sense electrode remote from its associated electronic circuitry comprising:
   an elongate shielded electrical conductor having an inner conductor coupled at a first end thereof to a sense electrode and having an outer shield conductor;
   a first unity gain amplifier having an input, an output, and at least one electrical power node;
   a source of high impedance AC signals coupled to a second end of said inner conductor and to the input of said first unity gain amplifier;
   a second unity gain amplifier having an input and an output, the input of said second unity gain amplifier being coupled to the output of said first unity gain amplifier;
   means coupling the output of said second unity gain amplifier to said at least one electrical power node of said first unity gain amplifier and to said outer shield conductor; and
   detection means for detecting variations in said high impedance AC signals indicative of an object in proximity to said sense electrode.

2. The highly sensitive capacitance proximity sensor according to claim 1 wherein said first unity gain amplifier comprises a transistor coupled in emitter follower configuration.

3. The highly sensitive capacitance proximity sensor according to claim 2 wherein the input of said first unity gain amplifier comprises the base of said transistor.

4. The highly sensitive capacitance proximity sensor according to claim 2 wherein said output of said first unity gain amplifier comprises the emitter of said transistor.

5. The highly sensitive capacitance proximity sensor according to claim 2 wherein said at least one electrical power node of said first unity gain amplifier comprises the collector of said transistor.

6. The highly sensitive capacitance proximity sensor according to claim 2 further including a constant current regulator coupled to the emitter of said transistor.

7. The highly sensitive capacitance proximity sensor according to claim 1 wherein said second unity gain amplifier comprises an operation amplifier having an inverting input, a noninverting input and an output.

8. The highly sensitive capacitance proximity sensor according to claim 7 further including means for shifting the DC bias voltage of the output of said second unity gain amplifier.

9. The highly sensitive capacitance proximity sensor according to claim 8 wherein said means for shifting the DC bias voltage of the output of said second unity gain amplifier comprises a second transistor coupled in diode configuration between the output of said operational amplifier and said inverting input.

10. A low input-capacitance unity gain amplifier circuit comprising:
- a follower amplifier transistor having an input, an output, and a power receiving node;
- an operational amplifier having inverting and non-inverting inputs and an output, the follower amplifier transistor output coupled to the non-inverting input, said operational amplifier output coupled to the power receiving node of the follower transistor; and
- means for coupling the operational amplifier output signal to the inverting input wherein said follower amplifier transistor input, output, and power receiving nodes all operate at substantially identical AC electrical potentials minimizing capacitive loading of the input signal, wherein said means includes a second transistor having characteristics similar to the characteristics of the follower amplifier transistor wherein the DC offset voltage between the output of the operational amplifier and the inverting input is substantially equal to and tracks with variations of circuit temperature a DC offset voltage between the input of the follower amplifier transistor and the non-inverting input of the operational amplifier.

11. A low input-capacitance unity gain amplifier circuit comprising:
- a follower amplifier transistor having an input, an output, and a power receiving node, wherein the follower amplifier transistor is a bipolar transistor having the base as input, the emitter as output, and the collector as power receiving node;
- an operational amplifier having inverting and non-inverting inputs and an output, the follower amplifier transistor output coupled to the non-inverting input, said operational amplifier output coupled to the power receiving node of the follower transistor; and
- means for coupling the operational amplifier output signal to the inverting input wherein said follower amplifier transistor input, output, and power receiving nodes all operate at substantially identical AC electrical potentials minimizing capacitive loading of the input signal.

12. A low input-capacitance unity gain amplifier circuit comprising:
- a follower amplifier transistor having an input, an output, and a power receiving node;
- a constant current regulator operatively coupled to the output of the follower amplifier transistor;
- an operational amplifier having inverting and non-inverting inputs and an output, the follower amplifier transistor output coupled to the non-inverting input, said operational amplifier output coupled to the power receiving node of the follower transistor; and
- means for coupling the operational amplifier output signal to the inverting input wherein said follower amplifier transistor input, output, and power receiving nodes all operate at substantially identical AC electrical potentials minimizing capacitive loading of the input signal.

13. A circuit for guarding a high impedance AC signal on a shielded electrical conductor having an inner conductor and an outer shield conductor comprising:
- a follower amplifier transistor having an input coupled to said inner conductor, an output, and a power receiving node;
- an operational amplifier having inverting and non-inverting inputs and an output, the follower transistor output coupled to the non-inverting input, said operational amplifier output coupled to the power receiving node of the follower transistor and to said outer shield conductor; and
- means for coupling the operational amplifier output signal to the inverting input wherein said follower amplifier transistor input, output, and power receiving nodes all operate at substantially identical AC electrical potentials thereby minimizing capacitive loading of the input signal wherein said means includes a second transistor having characteristics similar to the characteristics of the follower amplifier transistor wherein the DC offset voltage between the output of the operational amplifier and the inverting input is substantially equal to and tracks with variations of circuit temperature a DC offset voltage between the input of the follower amplifier transistor and the non-inverting input of the operational amplifier.

14. A circuit for guarding a high impedance AC signal on a shielded electrical conductor having an inner conductor and an outer shield conductor comprising:
- a followr amplifier transistor having an input coupled to said inner conductor, an output, and a power receiving node wherein the follower amplifier transistor is a bipolar transistor having the base as input, the emitter as output, and the collector as power receiving node;
- an operational amplifier having inverting and non-inverting inputs and an output, the follower transistor output coupled to the non-inverting input, said operational amplifier output coupled to the power receiving node of the follower transistor and to said outer shield conductor; and
- means for coupling the operational amplifier output signal to the inverting input wherein said follower amplifier transistor input, output, and power receiving nodes all operate at substantially identical AC electrical potentials thereby minimizing capacitive loading of the input signal.

15. A circuit for guarding a high impedance AC signal on a shielded electrical conductor having an inner conductor and an outer shield conductor comprising:
- a follower amplifier transistor having an input coupled to said inner conductor, an output, and a power receiving node;
- a constant current regulator operatively coupled to the output of the follower amplifier transistor;
- an operational amplifier having inverting and non-inverting inputs and an output, the follower transistor output coupled to the non-inverting input, said operational amplifier output coupled to the power receiving node of the follower transistor and to said outer shield conductor; and
- means for coupling the operational amplifier output signal to the inverting input wherein said follower amplifier transistor input, output, and power receiving nodes all operate at substantially identical AC electrical potentials thereby minimizing capacitive loading of the input signal.

* * * * *